(12) United States Patent
Abarra et al.

(10) Patent No.: US 8,507,113 B2
(45) Date of Patent: Aug. 13, 2013

(54) MAGNETIC SENSOR STACK BODY, METHOD OF FORMING THE SAME, FILM FORMATION CONTROL PROGRAM, AND RECORDING MEDIUM

(75) Inventors: Einstein Noel Abarra, Hachioji (JP); Tetsuya Endo, Komae (JP)

(73) Assignee: Canon Anelva Corporation, Kawasaki-shi (JP)

(*) Notice: Subject to any disclaimer, the term of this patent is extended or adjusted under 35 U.S.C. 154(b) by 117 days.

(21) Appl. No.: 13/319,209

(22) PCT Filed: May 28, 2010

(86) PCT No.: PCT/JP2010/003585
§ 371 (c)(1),
(2), (4) Date: Nov. 7, 2011

(87) PCT Pub. No.: WO2010/143370
PCT Pub. Date: Dec. 16, 2010

(65) Prior Publication Data
US 2012/0070693 A1    Mar. 22, 2012

(30) Foreign Application Priority Data

Jun. 9, 2009  (JP) .................................. 2009-137965

(51) Int. Cl.
*H01L 43/08* (2006.01)
*G01R 33/09* (2006.01)
*H01F 10/16* (2006.01)

(52) U.S. Cl.
CPC ............... *H01L 43/08* (2013.01); *G01R 33/09* (2013.01); *H01F 10/16* (2013.01)
USPC ... 428/811; 428/811.5; 428/815; 360/324.11; 360/324.12; 365/158; 365/171; 365/172; 365/173

(58) Field of Classification Search
None
See application file for complete search history.

(56) References Cited

U.S. PATENT DOCUMENTS

| | | | |
|---|---|---|---|
| 6,139,906 A | 10/2000 | Hegde et al. | |
| 6,185,081 B1 | 2/2001 | Simion et al. | |
| 6,379,747 B1 | 4/2002 | Sato | |
| 7,061,731 B2* | 6/2006 | Larson et al. | 360/324.12 |
| 7,072,156 B2* | 7/2006 | Cyrille et al. | 360/327.3 |

(Continued)

FOREIGN PATENT DOCUMENTS

| | | |
|---|---|---|
| JP | 11-189874 A | 7/1999 |
| JP | 2002-151755 A | 5/2002 |
| JP | 2003-086861 A | 3/2003 |
| JP | 2005-310264 A | 11/2005 |

*Primary Examiner* — Kevin Bernatz
(74) *Attorney, Agent, or Firm* — Fitzpatrick, Cella, Harper & Scinto

(57) ABSTRACT

The present invention is directed to align crystal c-axes in magnetic layers near two opposed junction wall surfaces of a magnetoresistive element so as to be almost perpendicular to the junction wall surfaces. A magnetic sensor stack body has, on sides of opposed junction wall surfaces of a magnetoresistive element, field regions for applying a bias magnetic field to the element. The field region has first and second magnetic layers having magnetic particles having crystal c-axes, the first magnetic layer is disposed adjacent to the junction wall surface in the field region, the crystal c-axes in the first magnetic layer are aligned and oriented along an ABS in a film plane, the second magnetic layer is disposed adjacent to the first magnetic layer in the field region, and the crystal c-axis directions in the second magnetic layer are distributed at random in a plane.

10 Claims, 13 Drawing Sheets

(56) References Cited

U.S. PATENT DOCUMENTS

| | | | |
|---|---|---|---|
| 7,161,763 B2 | 1/2007 | Ho et al. | |
| 7,360,300 B2 | 4/2008 | Carey et al. | |
| 7,551,408 B2 * | 6/2009 | Shimazawa et al. | 360/324.11 |
| 7,639,457 B1 * | 12/2009 | Chen et al. | 360/324.11 |
| 7,688,555 B2 * | 3/2010 | Zhang et al. | 360/324.12 |
| 7,848,065 B2 * | 12/2010 | Freitag et al. | 360/324.12 |
| 8,270,126 B1 * | 9/2012 | Roy et al. | 360/324.12 |
| 2003/0030947 A1 * | 2/2003 | Ooshima | 360/324.12 |
| 2004/0145836 A1 * | 7/2004 | Kojima et al. | 360/324.12 |
| 2005/0275975 A1 * | 12/2005 | Zhang et al. | 360/324.12 |
| 2011/0032645 A1 * | 2/2011 | Noel et al. | 360/326 |

* cited by examiner

MAGNETIC SENSOR STACK BODY, METHOD OF FORMING THE SAME, FILM FORMATION CONTROL PROGRAM, AND RECORDING MEDIUM

TECHNICAL FIELD

The present invention relates to a magnetic sensor stack body having magnetic layers for applying bias magnetic fields on both sides of a magnetoresistive element (reader stack), a method of forming the same, a film formation control program, and a recording medium.

BACKGROUND ART

As the capacity of a hard disk drive (HDD) increases in recent years, attention is being paid to an MR head using an element whose electric resistance changes according to fluctuations in external magnetic fields. Particularly, the sensitivity of a giant magnetoresistive (GMR) head and a tunnel magnetoresistive (TMR) head is very high, so that recording density of a magnetic disk can be increased. Further, as recording density becomes higher, miniaturization of an MR element is being promoted.

An MR head has a magnetoresistive element (MR element) whose two side surfaces are surrounded by magnetic layers which apply a bias magnetic field. When the MR element is miniaturized, naturally, the space which can be used by the bias magnetic layer is also regulated. When the volume of the magnetic layer and the areas of two side surfaces of the MR element are reduced, the bias magnetic field decreases.

The areas of the two side surfaces of the MR element are determined by a read gap (distance between two shields surrounding a magnetic tunnel junction (MTJ) or GMR stack layer) and stripe height (horizontal (depth) dimension of the MR element forming a right angle with the surface of a recording medium). Decrease in the read gap width is necessary to increase linear resolution (on tracks), and decrease in stripe height causes decrease in the width of the read head necessary to decrease the sensitivity to a track edge.

A typical sensor structure includes an antiferromagnetic (AFM) pinning layer, a synthetic antiferromagnetic layer (SAF), a nonmagnetic spacer or a tunnel insulator, and a ferromagnetic free layer. A seed layer and a capping layer are also used for various purposes. The SAF is made of two ferromagnetic members coupled in opposite directions via a thin spacer layer. The ferromagnetic member in the SAF includes a pinned layer which is in contact with the AFM layer and a reference layer which is in contact with the nonmagnetic spacer layer or the tunnel insulator. A resistance change via the reader stack is determined by relative directions of magnetizations between the reference layer and the free layer. In the free layer, the magnetic field is biased and oriented to form a right angle with the reference layer. With the configuration, reading sensitivity becomes very high, and a linear response can be obtained to an external magnetic field from a recording medium. The bias magnetic field is also called "hard bias" and is expected to be maintained constant throughout the life of a disk drive. The hard bias has a role of preventing creation of a magnetic domain in a free layer. Both the sensor and the hard bias are sandwiched by two thick soft magnetic shields.

A simple hard bias stack body includes an underlayer made of Cr, W, or the like, a magnetic layer made of CoPt or CoCrPt, and a capping layer made of Cr, Ru, or Ta. To prevent switching caused by an external magnetic field at particularly high operation temperature, the coercive force (Hc) of the magnetic layer is desired to be equal to or higher than 159.5 kA/m (2000 oersted (Oe)).

When magnetization reversal occurs in a part of magnetic layer crystal grains, there is the possibility that remarkable decrease in the bias magnetic field is caused, and noise in a sensor is induced. Reduction in the read gap size leads to decrease in thickness of the hard bias stack body which can be applied between shields. Since the bias magnetic field is proportional to the product (Mrt) between residual magnetization of the magnetic layer and thickness, when the thickness "t" decreases, application of bias to the free layer may become insufficient. Further, when the magnetic layer and the shield layer become close to each other, a leakage magnetic flux to the shield layer increases, and the bias magnetic field in the junction wall surface (the border between the reader stack and the hard bias stack body) further decreases.

One of methods of increasing the magnetic field is to decrease the thickness of the insulating layer that insulates the magnetic layer from the free layer in the junction wall surface. However, since a low leak current and a high breakdown voltage are requested, there is a limit to decrease the thickness of the insulator. The magnetic layer can be made of an insulating material such as ferrite. By making the magnetic layer of an insulating material, the insulating layer may not be provided, or the thickness of the insulating layer can be decreased to 3 nm or less. However, there is a tendency that saturated magnetizations and coercive forces of most of insulating magnetic ferrites are inferior to those of Co—Pt alloys. It is much difficult to control the compositions and crystal growth of the ferrites.

The present CoPt-based hard bias stack body has two-dimensional isotropy. In a plane, the coercive forces Hc along any directions are equal. That is, OR (orientation ratio, that is, the ratio between coercive force in an in-plane perpendicular direction with respect to the stripe height and coercive force in the stripe height direction) indicative of magnitude of magnetic anisotropy is equal to 1. Hexagonal crystal c-axes of CoPt are at random in a plane. However, by exchange coupling of a number of crystal grains, a relatively high squareness ratio (0.85 or higher) can be realized. On the junction wall surface, an average magnetic field is directed toward the free layer. When the stripe height decreases, the crystal grains in the junction wall surface decrease, so that it becomes more difficult to direct the magnetic flux toward the free layer. This phenomenon is conspicuous when the c-axes of the crystal grains are not oriented to the free layer. If the c-axes can be oriented toward the junction wall surface, the ratio of the stripe height (depth) to the crystal grain diameter is not a matter. Further, Mr to the same thickness "t" increases, and a higher bias magnetic field can be obtained. A larger number of magnetic fluxes are condensed on the junction wall surface, and the magnetic fluxes which are lost at side ends of the hard bias stack body decrease.

A Cr seed layer is grown in a (110) lattice plane. From the studies of OR in longitudinal media, OR>1 is achieved only in the case of a Cr (002) lattice plane. A CoPt (1120) is formed on it. With respect to the epitaxial relations between the [110] direction and [1-10] direction, for CoPt (in the (1120) lattice plane, the lattice constant in the c-axis direction is 0.41 nm, and that of a lattice axis perpendicular to the c-axis is 0.43 nm), it is equivalent in energy. Only in the case where a Cr lattice is deformed in a plane due to an anisotropic stress, a specific direction is desired. Simions et al. (refer to patent document 1) propose different seed layers made of MgO, NiAl, and the like. In study of recording media, it was proven that both underlayers provide two-dimensional c-axis alignment.

However, Larson et al. (refer to patent document 2) and San Ho et al. (refer to patent document 3) disclose that in-plane anisotropy can be realized by formation of a film of CoPt alloy using oblique sputtering.

In-plane anisotropy of a soft layer of FeCo or the like can be easily realized by oblique sputtering. Particularly, in a sputtering process having a high incidence angle to normal of a film formation face, in-plane anisotropy occurs even in a relatively thin film (about 10 nm) by the self shadow effect. The self shadow effect denotes that a shadow is created by nucleus generated on the surface of an oblique incidence deposition film and, since sputter particles do not fly in the shadow portion, the film grows in an oblique column shape. In our experience, in a CoPt layer having an optimum thickness (about 20 nm), dependency of in-plane anisotropy on the incident angle is low, so that a seed layer or an underlayer has to be thickened. However, a seed layer has to be thin (6 nm or less), and it makes it very difficult to form a hard bias stack film according to a result of study of Larson et al. and San Ho et al. San Ho et al. suggests that a magnetic layer has a (11-20) lattice plane to show OR of a certain degree. In evaluation by an XRD (X-ray diffractiometer), a (10-10) lattice plane is shown. An obliquely deposited underlayer does not display the (002) plane which is considered to be necessary to induce the OR in a longitudinal recording medium (Mirzamaani). As suggested by the concept of Larson et al., the hard bias OR is induced by probably anisotropy caused by exchange coupling. "Mrt" is the largest along a direction in which the exchange coupling is the maximum. It is considered that OR is induced by a wavy surface pattern (anisotropy roughness by Carey et al. (refer to patent document 4)).

The present hard bias deposition is performed mostly by the long throw sputtering such as ion beam deposition (IBD). An IBD system has a stage which is rotatable to adjust the incidence angle of an incident sputter particle. For example, Hegde et al. (refer to patent document 5) disclose methods of depositing hard bias films. A magnetic layer is deposited at an almost perpendicular angle (25 degrees or less from the perpendicular line).

PRIOR ART DOCUMENTS

Patent Documents

Patent document 1: U.S. Pat. No. 6,185,081
Patent document 2: U.S. Pat. No. 7,061,731
Patent document 3: U.S. Pat. No. 7,161,763
Patent document 4: U.S. Pat. No. 7,360,300
Patent document 5: U.S. Pat. No. 6,139,906

DISCLOSURE OF THE INVENTION

Problems to be Solved by the Invention

To reduce problems of decrease in OR depending on the incident angle of deposition of a magnetic layer and a thick underlayer and a thick seed layer required to obtain sufficient OR, an optimum method for condensing magnetic fluxes to a junction wall surface is necessary.

FIGS. 13 and 14 are outline drawings each showing a profile perpendicular to a stack direction of a conventional magnetic sensor stack body. Arrow 72 indicates the magnetization directions of magnetic particles after the hard bias stack body is magnetized. By the magnetization, a bias magnetic field is generated to the right direction in a free layer (in FIG. 13) of a reader stack 70. The crystal c-axis directions in the magnetic layer are distributed at random two-dimensionally in a plane.

By using exchange coupling, adjacent magnetizations are oriented more parallel to each other. By miniaturization of crystal particles or extension of the stripe height (depth) "S" (refer to FIG. 13), an average value of the magnetization directions in the junction wall surface becomes sufficiently large, and a magnetic field which is relatively uniform can be generated in the entire free layer. On the other hand, when the number of crystal particles is small and the area of the free layer is small (FIG. 14), due to the influence of directions of anisotropy of crystal particles, uniformity of magnetization in the reader stack 70 deteriorates. Nonuniformity of magnetic fields causes noise in a read head.

To promote reduction in an MR element, it is sufficient to make the crystal c-axes in the magnetic layer of the hard bias stack body oriented almost perpendicular to the junction wall surface between the reader stack and the hard bias stack body so as to condense the magnetic fluxes to the junction wall surface. In other words, it is sufficient to make the crystal c-axes oriented in a direction along the ABS (Air Bearing Surface) as a surface facing a magnetic recording medium (FIG. 2).

An object of the present invention is to provide a magnetic sensor stack body in which c-axes in a magnetic layer on a junction wall surface between a reader stack and a hard bias stack body are oriented almost perpendicular to the junction wall surface and magnetic fluxes can be condensed to the junction wall surface, a method of forming the same, a film formation control program, and a recording medium.

Means for Solving the Problems

The configurations of the present invention made to achieve the object are as follows.

A magnetic sensor stack body according to the present invention includes, on sides of opposed junction wall surfaces of a magnetoresistive element, field regions for applying a bias magnetic field to the element. In the magnetic sensor stack body, the field region includes first and second magnetic layers having magnetic particles having crystal c-axes, the first magnetic layer is disposed adjacent to the junction wall surface in the field region, the crystal c-axes in the first magnetic layer are aligned and oriented along an ABS in a film plane, the second magnetic layer is disposed adjacent to the first magnetic layer in the field region, and the crystal c-axis directions in the second magnetic layer are distributed at random in a plane.

In addition, a method of forming a magnetic sensor stack body according to the present invention is a method for forming a hard bias stack body for applying a bias magnetic field to a magnetoresistive element in field regions on sides of opposed two junction wall surfaces of the magnetoresistive element disposed on a substrate. In the method of forming a magnetic sensor stack body, a process of forming the hard bias stack body comprises a step of forming an underlayer at a film forming angle $\theta_1$ ($\theta_1$=0 to 25 degrees) from the normal of the substrate, a step of forming a first magnetic layer at a film forming angle $\theta_2$ ($\theta_2$=50 to 90 degrees) from the normal of the substrate, a step of forming a second magnetic layer at a film forming angle $\theta_3$ ($\theta_3$=0 to 25 degrees) from the normal of the substrate, and a step of forming a capping layer at a film forming angle $\theta_4$ ($\theta_4$=0 to 45 degrees) from the normal of the substrate.

Effect of the Invention

According to the present invention, crystal c-axes in a first magnetic layer disposed adjacent to a junction wall surface of a magnetoresistive element are along an ABS of the element in a plane. Therefore, since the crystal c-axes in the first magnetic layer adjacent to the junction wall surface are oriented almost perpendicular to the junction wall surface, an excellent effect such that the magnetic fluxes can be condensed to the magnetoresistive element is produced.

MODES FOR CARRYING OUT THE INVENTION

Embodiments of the present invention will be described below with reference to the drawings. The invention, however, is not limited to the embodiments.

[Structure of Magnetic Sensor Stack Body]

Figure 1:
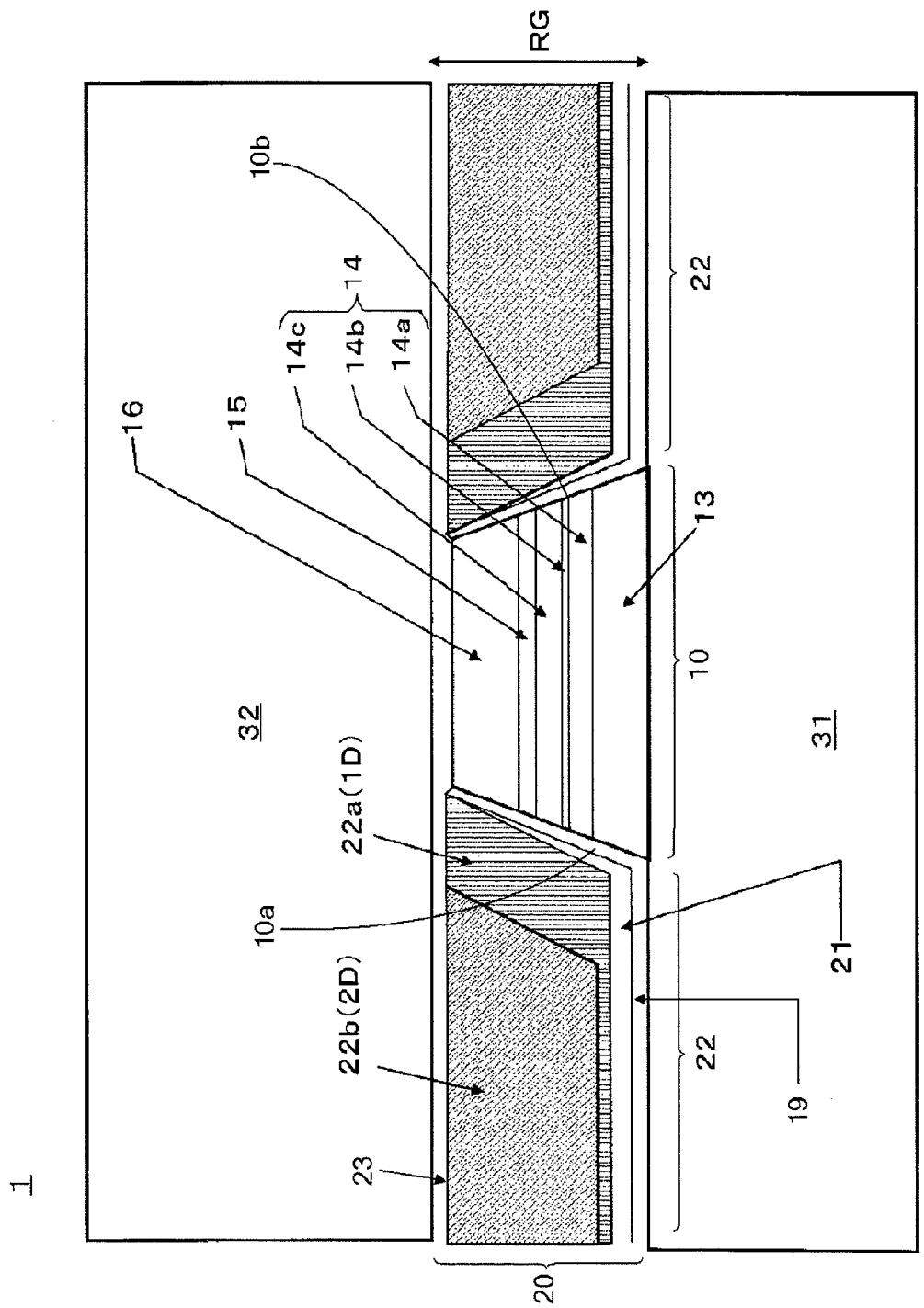
FIG. 1 An outline drawing schematically showing a magnetic sensor stack body according to the present invention.
Figure 2:
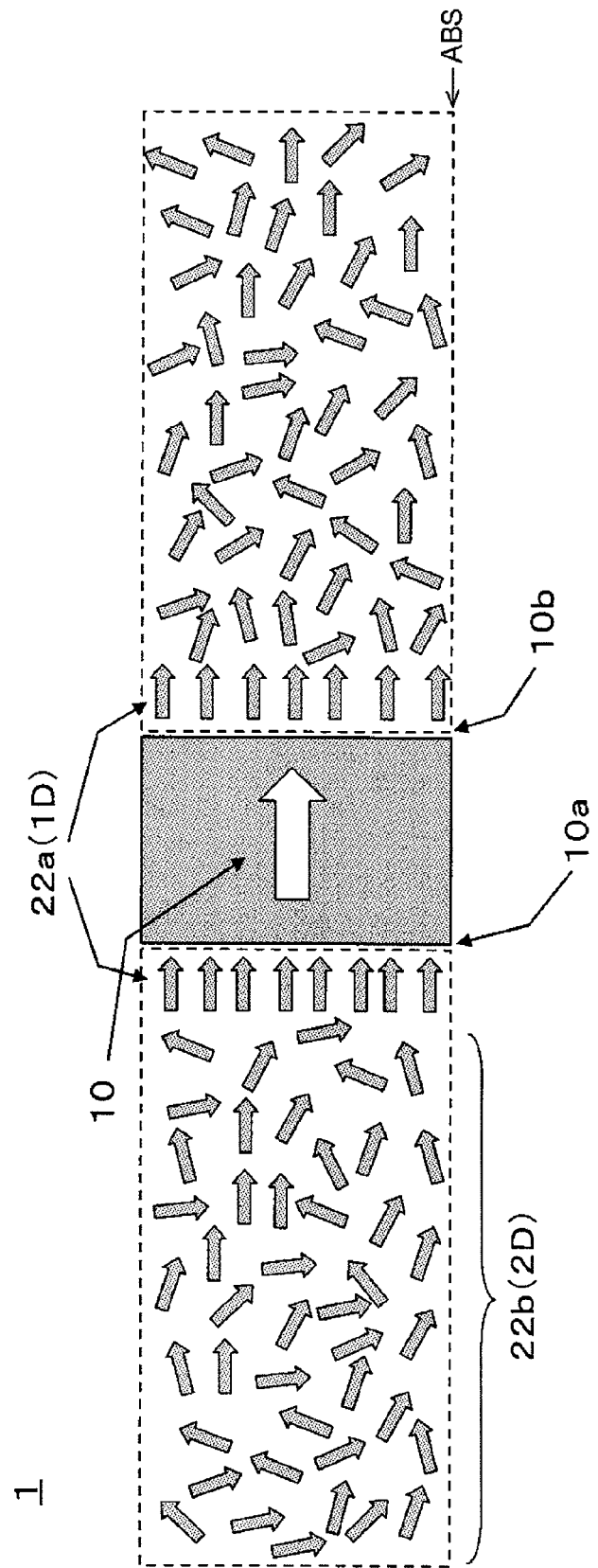
FIG. 2 An outline drawing showing a section in a direction perpendicular to a stack direction of the magnetic sensor stack body according to the present invention.

First, with reference to FIGS. 1 and 2, the structure of a magnetic sensor stack body having a magnetoresistive element will be described. FIG. 1 is an outline drawing schematically showing a magnetic sensor stack body according to the present invention. FIG. 2 is an outline drawing showing a profile perpendicular to a stack direction of the magnetic sensor stack body according to the present invention.

As shown in FIG. 1, a magnetic sensor stack body 1 according to the present invention has, in an almost center on a substrate 31, a magnetoresistive element (reader stack) 10 made of a plurality of stack films having different compositions and having the magnetoresistive effect in which an electric resistance value fluctuates when a magnetic field is applied. The magnetic sensor stack body 1 also has, in field regions 22 on the sides of two opposed junction wall surfaces 10a and 10b of the reader stack 10, hard bias stack bodies 20 which can apply a bias magnetic field to the reader stack 10. The magnetic sensor stack body is an interim product before a sensor for a magnetic read head of a hard disk drive or the like is cut.

The reader stack 10 illustrated in FIG. 1 is a magnetic tunnel junction body (MTJ) having an oxide barrier layer (MgO) just below a free layer 16. The reader stack 10 is not limited to the above but may be a giant magnetoresistance junction body (GMR) most part of which being made of a metal having very low resistance.

Concretely, the reader stack 10 is, for example, stacked on a bottom shield layer 31 made of a soft magnetic material such as NiFe and has, mainly, an antiferromagnetic pinning layer (AFM layer) 13, a synthetic antiferromagnetic layer (SAF layer) 14, a spacer layer 15, and a ferromagnetic free layer 16.

The AFM layer 13 is made of, for example, an antiferromagnetic material such as IrMn. The AFM layer 13 is, for example, stacked over the bottom shield layer 31, as necessary, via a pre-seed layer (11 in FIG. 3) made of Ta or the like and a seed layer (12 in FIG. 3) made of Ru or the like which are not shown.

The SAF layer 14 is made by two ferromagnetic layers 14a and 14c coupled in opposite directions via a thin coupling layer (a nonmagnetic layer or a tunnel insulating layer) 14b. The ferromagnetic layers of the SAF layer 14 are a pinned layer 14a which is in contact with the AFM layer 13 and a reference layer 14c which is in contact with the coupling layer 14b.

The spacer layer 15 is a nonmagnetic layer or a tunnel insulating layer and is, for example, an oxide layer made of MgO or the like.

The free layer 16 is made of, for example, a ferromagnetic material such as CoFeB and may be a layer obtained by stacking a Ta layer or an NiFe layer on a ferromagnetic layer made of CoFeB or the like. A bias magnetic field is applied to the free layer 16, and the free layer 16 is oriented so as to form a right angle with the reference layer 14c. With the layout, sensor sensitivity can be made high and linear response to an external magnetic field from a recording medium is provided. The bias magnetic field is also called "hard bias" and expected to be maintained constant throughout the life of a disk drive. The hard bias prevents a magnetic domain from being formed in the free layer 16. A magnetic resistance change through the reader stack 10 is determined by relative directions of magnetizations of the reference layer 14c and the free layer 16.

As necessary, the free layer 16 is covered with not-shown capping layers (17a and 17b in FIG. 3) made of a material selected from, for example, Cr, Ru, Ta, Ti, alloys of them, C, and the like.

As described above, the hard bias stack body 20 is formed in the field region 22 on the substrate 31, and includes first and second magnetic layers 22a and 22b having magnetic particles having a crystal c-axis.

As shown in FIG. 2, in the magnetic sensor stack body 1 of the embodiment, in the field region 22 apart from the reader stack 10, the crystal c-axis directions in the second magnetic layer 22b are distributed at two-dimensional (2D) random in the film plane. On the other hand, the first magnetic layer 22a in the field region 22 is in a region adjacent to the junction wall surfaces 10a and 10b of the reader stack 10, and the c-axes (that is, the crystal particle magnetization axes) are oriented one-dimensionally (1D). The direction is along the ABS in the film plane and is almost perpendicular to the junction wall surfaces 10a and 10b. The first magnetic layer 22a in the field region 22 has the function of converging the magnetic flux from the second magnetic layer 22b apart from the reader stack 10. Therefore, since the c-axes of the first magnetic layer 22a in the field region 22 are oriented near the reader stack 10, the bias efficiency does not depend on the crystal particle diameter. Further, local magnetic fields in the junction wall surfaces at an end of the free layer 16 tend to become more uniform even in the case where the stripe height (depth) is decreased.

Referring to FIG. 1 again, the first and second magnetic layers 22a and 22b are made of, for example, an alloy (permanent magnet) having a hexagonal crystal structure (hcp) selected from Co—Pt, Co—Cr—Pt, and a group of alloys of Co—Pt and Co—Cr—Pt. The invention is not limited to the materials. The first magnetic layer 22a may be made of an alloy having a face-centered tetragonal structure (fct) selected from Fe—Pt, Co—Pt, and a group of alloys of Fe—Pt and Co—Pt.

The first and second magnetic layers 22a and 22b are stacked on the bottom shield layer as the substrate 31 via, as necessary, an underlayer 21. The underlayer 21 is made of, for example, any of Cr, Cr—Mo, Cr—Ti, Nb, Ta, and W and an alloy having a body-centered cubic crystal structure (bcc) selected from an alloy group of them. The underlayer 21 has, for example, a thickness which is 3 to 8 nm in the field region and is less than 3 nm in the junction wall surface.

Figure 12:
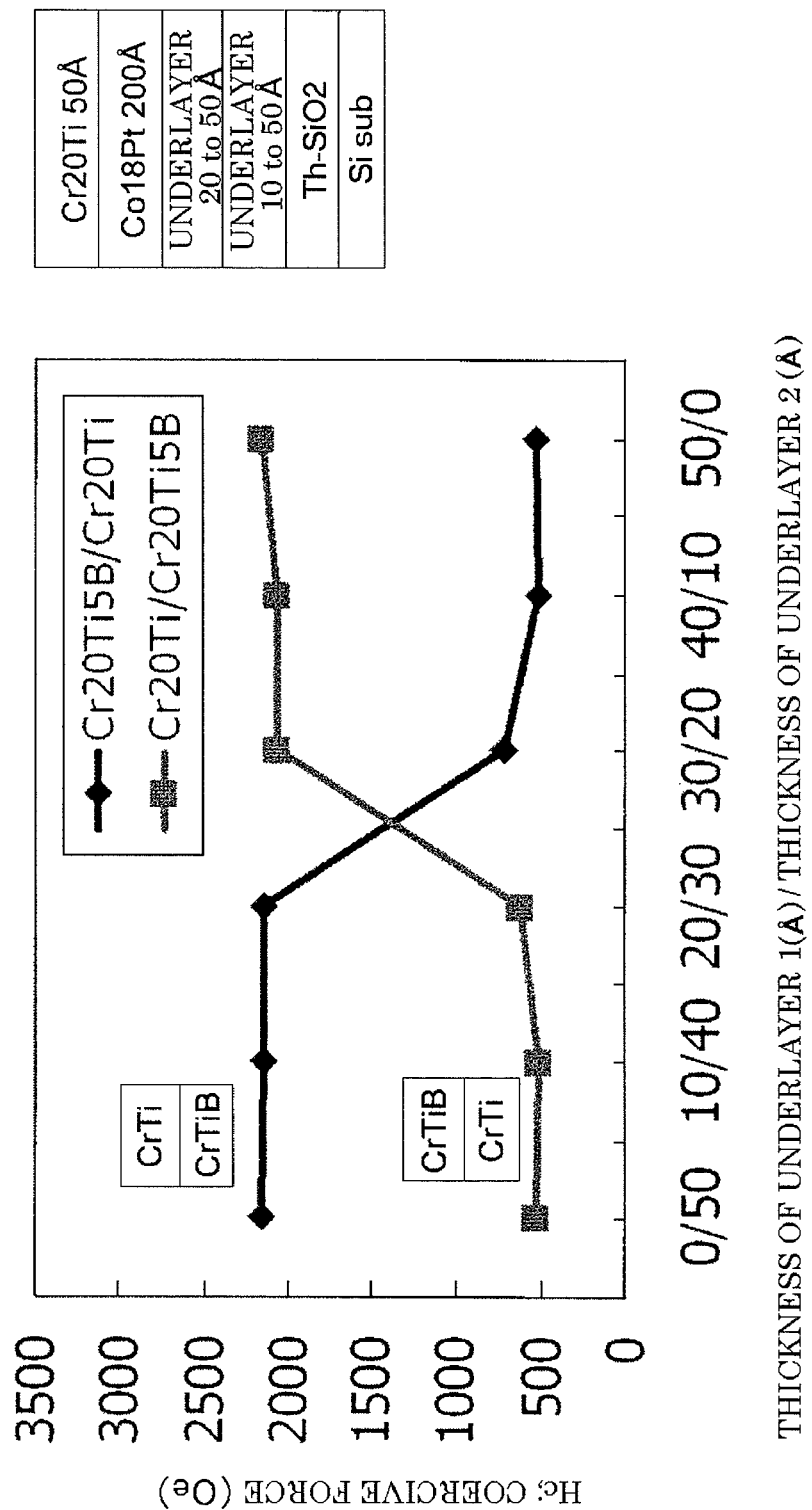
FIG. 12 A coercive force of the CoPt layer of 20 nm on a double-layered underlayer.
Figure 13:
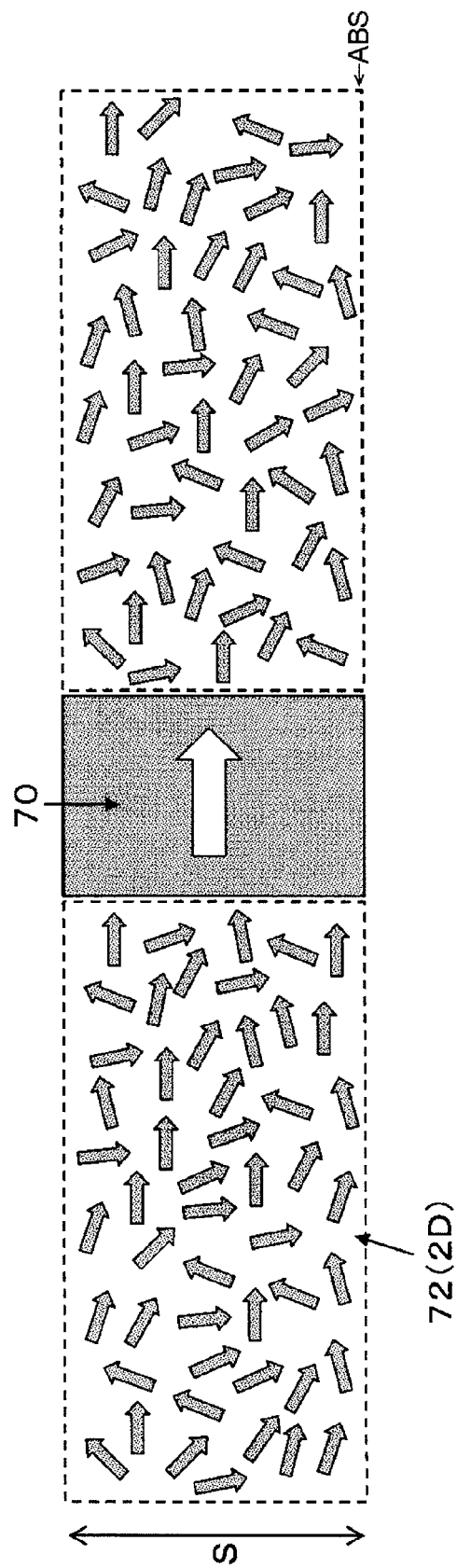
FIG. 13 An outline drawing showing a section in a direction perpendicular to a stack direction of a conventional magnetic sensor stack body.
Figure 14:
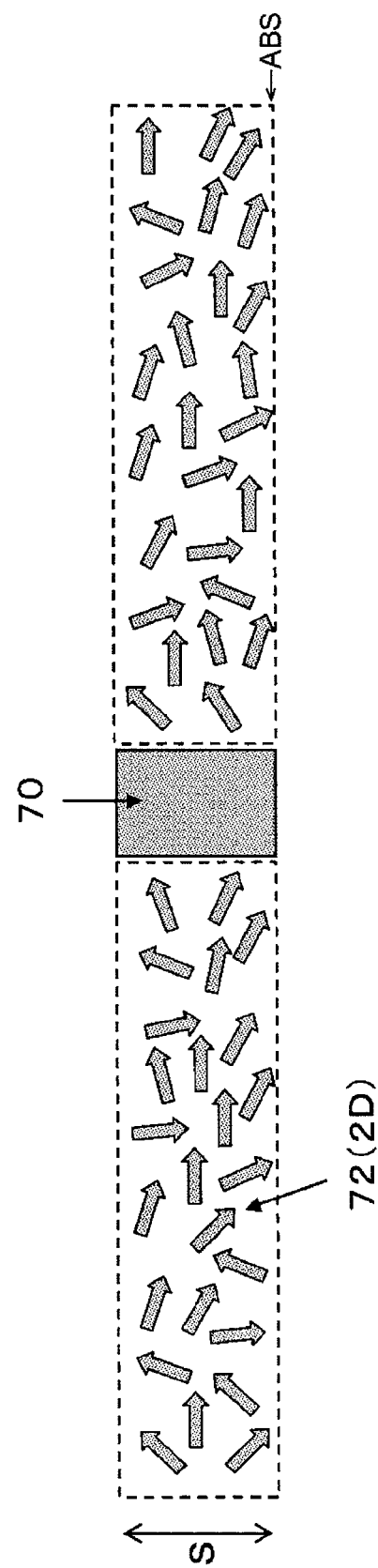
FIG. 14 An outline drawing showing a section in a direction perpendicular to the stack direction of the conventional magnetic sensor stack body.

In the underlayer 21, a double-layered underlayer may be constructed by adding a not-shown seed layer on the underlayer 21 (refer to the after-mentioned description of FIG. 12). The junction wall surfaces 10a and 10b in the field region 22 and the reader stack 10 may further have a seed layer selected from, for example, CrB, CrTiB, MgO, Ru, Ta, and Ti or an alloy selected from an alloy group of them. The seed layer has, for example, a thickness which is less than 1 nm in the field region and is 0.5 to 2 nm in the junction wall surface. Meanwhile, as will be described based on FIG. 12 later, CrTiB is not appropriate as a pre-underlayer layer (pre-seed layer) in relation to crystal growth and is preferably formed on the Cr—Ti underlayer 21.

As necessary, the field region 22 and the junction wall surfaces 10a and 10b are covered with a capping layer 23 made of, for example, a material selected from Cr, Ru, Ta, Ti, a group of alloys of Cr, Ru, Ta, and Ti, and C.

Further, an insulating layer 19 made of $Al_2O_3$ or the like is disposed in a lower part of the field region 22 and on the junction wall surfaces 10a and 10b of the reader stack 10. The insulating layer 19 has a thickness of 2 to 10 nm in the field region and has a thickness of 2 to 5 nm in the junction wall surface.

The magnetic sensor stack body 1 has the bottom shield layer 31 below the insulating layer 19 and has a top shield layer 32 on the capping layer 23. The shield layers 31 and 32 are made of, for example, a soft magnetic material such as NiFe. That is, the reader stack 10 and the field region 22 are sandwiched between the two thick soft magnetic shield layers 31 and 32.

[Method of Forming Magnetic Sensor Stack Body]

Next, with reference to FIGS. 3 to 12, the operation of the magnetic sensor stack body 1 will be described and a method of forming the magnetic sensor stack body 1 according to the present invention will be also described.

Figure 3:
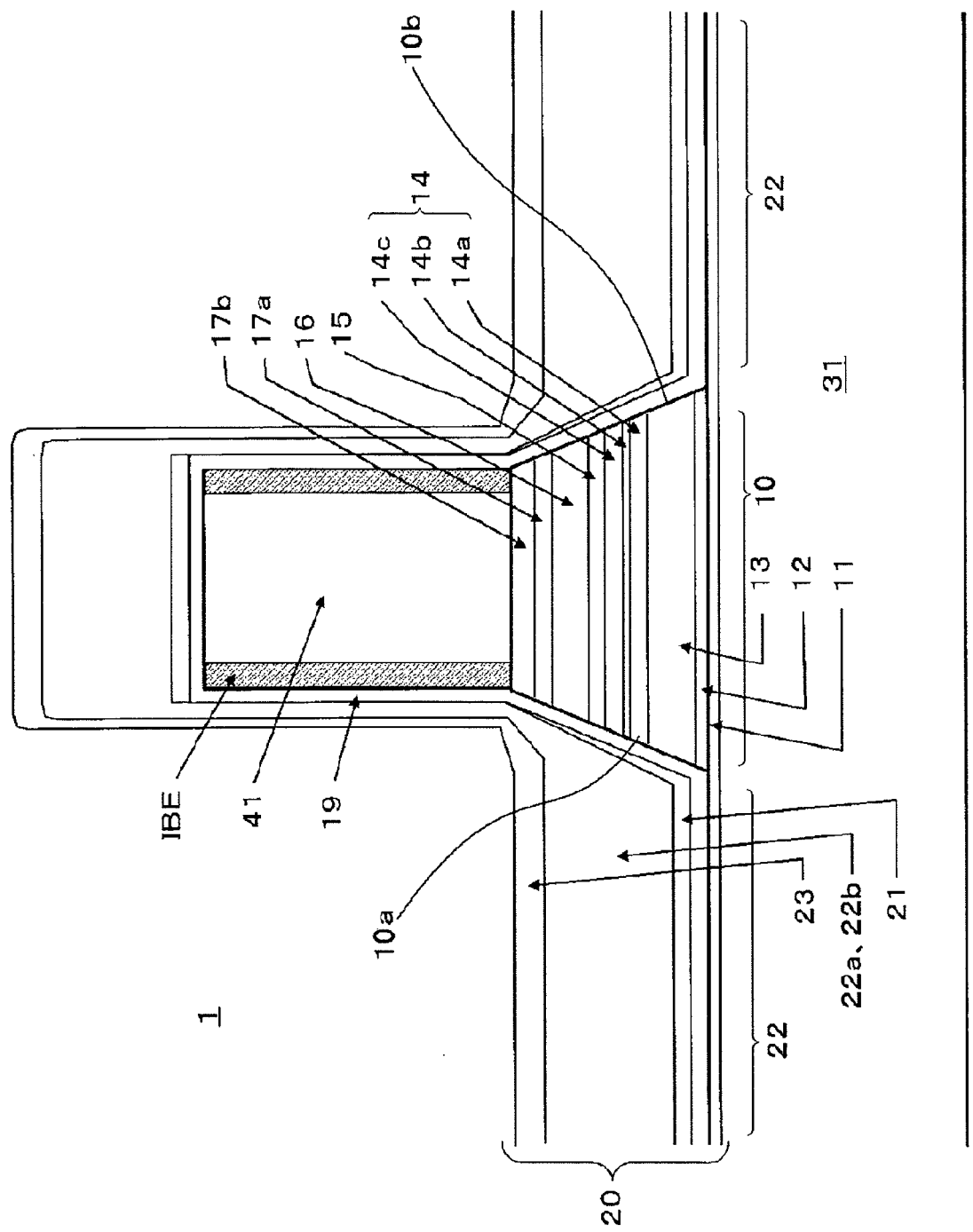
FIG. 3 An outline drawing in which a photoresist mask is disposed on a magnetoresistive element.

FIG. 3 is an outline drawing showing a magnetic sensor stack body in which a photoresist mask is disposed on the magnetoresistive element. As shown in FIG. 3, for formation of the magnetic sensor stack body 1, the reader stack 10 is first formed on the substrate 31. Next, the photoresist (PR) mask 41 is applied, patterned, and developed. As the substrate 31, for example, a bottom shield layer made of a soft magnetic material such as NiFe is employed.

The photoresist mask 41 is used to mask a part of the reader stack 10 in the etching process. For the etching process, for example, ion beam etching (IBE) or reactive ion etching (RIE) is employed. In the case of using the RIE, a hard mask may be formed on the reader stack 10. In this case, the photoresist mask 41 is initially used to form a hard mask and is removed by an oxygen ashing process before the reader stack 10 is etched.

After the etching process, the insulating layer 19 is coated on the magnetic sensor stack body (the reader stack 10 including the photoresist mask 41 and its junction wall surfaces 10a and 10b). For the coating of the insulating layer 19, it is preferable to use an oxide insulator (3 to 5 nm) such as $Al_2O_3$ or $SiO_2$ and, for example, a film forming method such as the physical vapor deposition (PVD), ion beam deposition (IBD), atomic layer deposition (ALD), or chemical vapor deposition (CVD) is used. The ALD and CVD have an advantage that conformal film formation is possible.

Next, the hard bias stack body 20 is formed on the insulting layer 19. In the case of the basic hard bias stack body 20, the underlayer 21 is first formed on the insulating layer 19, and subsequently the magnetic layers 22a and 22b and the capping layer 23 are formed. Depending on the shape of the reader stack 10, the underlayer 21 may be formed at an angle further oblique than the second magnetic layer 22b to be coated on the junction wall surfaces 10a and 10b to some extent. This can be done by an ion beam deposition (IBD) system illustrated in FIG. 4 due to its high controllability.

Figure 4:
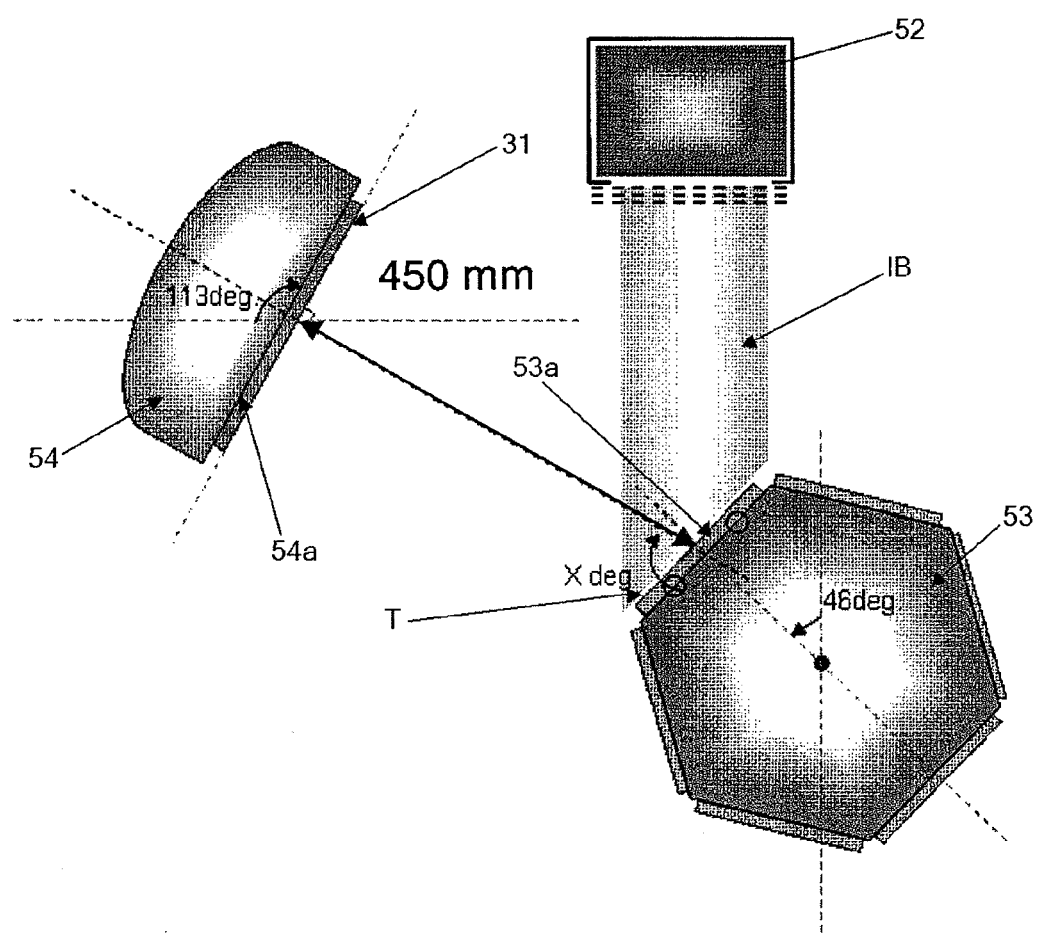
FIG. 4 An outline drawing showing an ion beam film formation system.

FIG. 4 is an outline drawing showing the IBD system. An IBD system 51 shown in FIG. 4 is a system to conduct an existing deposition method and can be applied to the present embodiment. The IBD system 51 has a beam irradiation apparatus 52 for emitting an ion beam toward the target T, a rotation carousel 53 on which a plurality of targets T are mounted, and a substrate holder 54 for holding the substrate (wafer) 31.

An ion beam IB from the beam irradiation apparatus 52 is extracted from a plasma source by a grid G electrically biased and directed toward the irradiation target T. By directing the beam IB at a specific angle, most of sputter particles can be deposited on the substrate 31 on the substrate holder 54.

The rotation carousel 53 has a polygonal shape (for example, hexagonal shape) and has target mounting faces 53a. On the target mounting faces 53a, a plurality of targets T are mounted. As the target material, for example, $Al_2O_3$, Cr, CoPt, Ta, or the like is employed. The rotation carousel 53 rotates so that the target material to be sputtered by the ion beam IB faces the substrate 31. The size of the target mounting face 53a is usually 40 cm×30 cm.

The substrate holder 54 holds the substrate 31 by a stage 54a facing the irradiation target T on the rotation carousel 53. The substrate holder 54 can be rotated by not-shown rotating means and turns the substrate 31 during deposition in order to improve uniformity of film formation. The substrate holder 54 can change the angle of the substrate 31 with respect to incident particles from the irradiation target T by making the stage 54a inclined.

The distance from the substrate 31 to the irradiation target can be set larger than, for example, 40 cm. The longer the distance becomes, the more the incident particles are improved to parallel irradiation. However, a target cannot be used well, and a vacuum chamber becomes large.

In the conventional film forming method, CoPt needs to be formed at an almost perpendicular angle to a film formation face (10 to 25 degrees from a normal of the film formation face) in order to reduce film formation on the junction wall surfaces 10a and 10b and promote epitaxial growth from an underlayer to the upper layers (Hegde et al.) A great deal of attachment of the underlayer 21 to the junction wall surfaces may generate CoPt crystal grains whose crystal c-axes are directed upward (parallel to the junction wall surfaces) toward the top shield layer. This causes a change of the magnetic flux direction in the magnetic layer to the free layer 16. Accordingly, film formation in which an incidence angle (angle from the normal of the film formation face) is higher on the junction wall surfaces than that in the field region 22 is required.

Under such circumstances, we propose a method of forming the underlayer 21 to be initially formed at an almost perpendicular angle to the face of the substrate 31 so that the film thickness on the junction wall surfaces 10a and 10b may be minimum. Thereafter, the first magnetic layer 22a is formed on the insulating layer 19 exposed mainly on the junction wall surfaces 10a and 10b at a high incidence angle (angle from a normal of the substrate 31). This can promote growth of a (0001) lattice plane of the first magnetic layer 22a on the junction wall surfaces 10a and 10b. Subsequently, the second magnetic layer 22b is formed in the field region 22 at an almost perpendicular angle to the face of the substrate 31, that is, at a low incidence angle (angle from the normal of the substrate 31). The field region 22 herein is each of the regions on both sides of the reader stack 10. The crystal c-axis directions in the second magnetic layer 22b are almost at random two-dimensionally as it is influenced by a (110) lattice plane of the underlayer 21.

Figure 5:
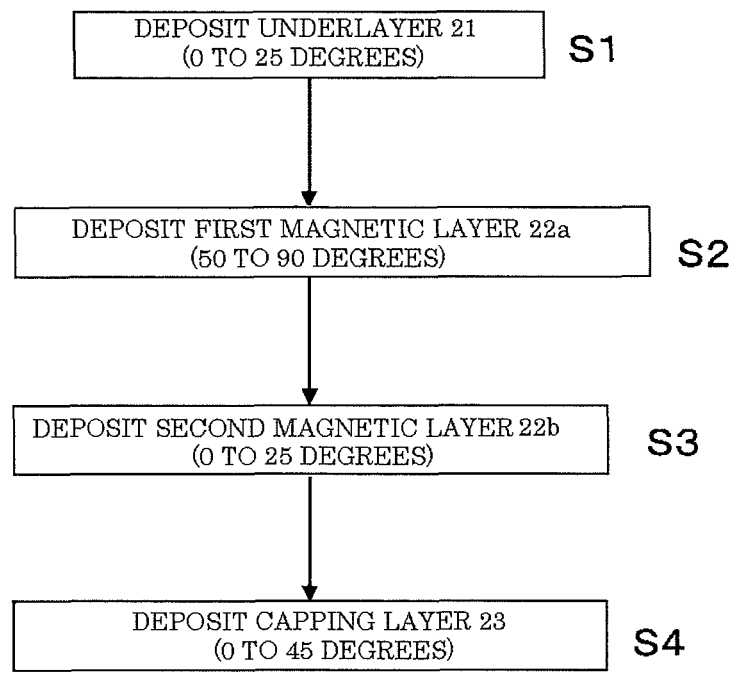
FIG. 5 A process chart showing procedure of forming a hard bias stack body in a method of forming a magnetic sensor stack body according to the present invention.

FIG. 5 is a process chart showing procedure of forming the hard bias stack body 20 constituting the magnetic sensor stack body 1 according to the present invention in the field region 22.

As shown in FIG. 5, specific procedure of step of forming the hard bias stack body 20 in the field region 22 has a first step (step 1 which will be described as "S1" below) of forming the underlayer 21 at a film forming angle $\theta_1$ ($\theta_1$=0 to 25 degrees) from the normal of the substrate 31. The step has a second step (S2) of forming the first magnetic layer 22a at a film forming angle $\theta_2$ ($\theta_2$=50 to 90 degrees, preferably 50 to 80 degrees) from the normal of the substrate 31. The step has a third step (S3) of forming the second magnetic layer 22b at a film forming angle $\theta_3$ ($\theta_3$=0 to 25 degrees) from the normal of the substrate 31. The step has a fourth step (S4) of forming the capping layer 23 at a film forming angle $\theta_4$ ($\theta_4$=0 to 45 degrees) from the normal of the substrate 31.

Figure 6:
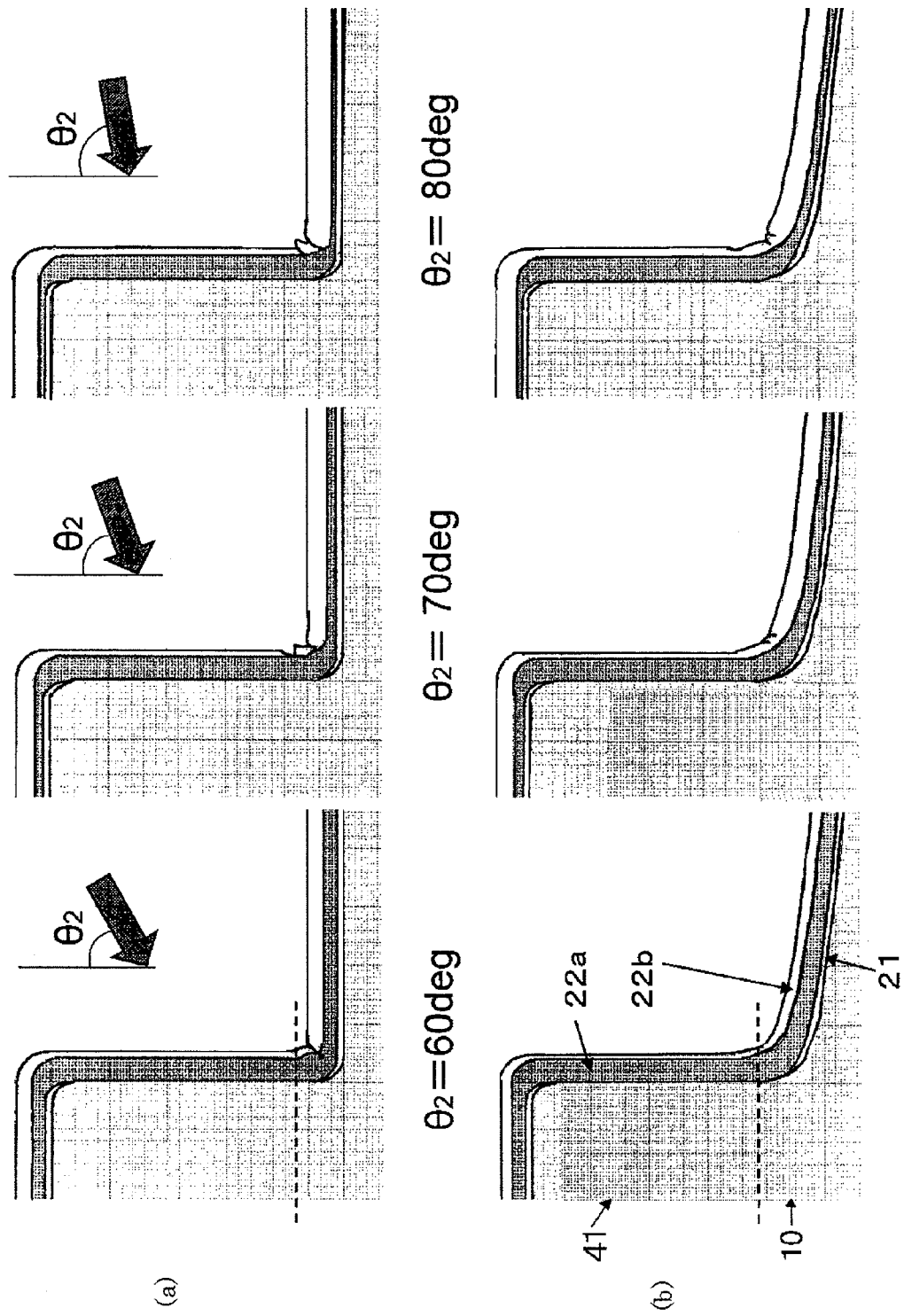
FIG. 6 An Explanatory diagram showing thickness profiles calculated at different angles for forming a first magnetic layer on junction wall surfaces inclined steeply and gently.

FIG. 6 is an explanatory diagram showing as profiles calculation results in two cases where the junction wall surfaces 10a and 10b are inclined steeply and gently ((a) is a case where the junction wall surfaces are inclined steeply, and (b) is a case where the junction wall surfaces are inclined gently) when a first CoPt layer (first magnetic layer) 22a is formed at a different incidence angle (angle from the normal of the substrate 31) to the junction wall surfaces inclined at each angle, that is, at a film forming angle $\theta_2$. The underlayer 21 and a second CoPt layer (second magnetic layer) 22b are formed by incidence almost perpendicular to the face of the substrate 31. The underlayer 21 is very thin on the junction wall surfaces 10a and 10b. The first magnetic layer 22a in the field region 22 is thinner as the incidence angle is larger (becomes a more acute angle with respect to the face of the substrate 31). Forming the second magnetic layer 22b in a direction almost perpendicular to the face of the substrate 31 is advantageous in that film forming speed is higher on the field region 22 than on the photoresist mask 41 and the junction wall surfaces 10a and 10b. After formation of the capping layer 23 (not shown), the photoresist mask 41 is removed as a dashed line in FIG. 6 by chemical mechanical polishing (CMP) or an ion beam planarizing process. Although the films covering the junction wall surfaces 10a and 10b and the photoresist mask 41 are much thicker than in a conventional film forming method, this should be able to be dealt with sufficiently by a conventionally used planarizing process.

The orientation of magnetism is achieved, for example, by IBD, PVD, or the like as shown in FIG. 4. In the case of a large substrate (wafer of 5 to 8 inches), however, since the incidence angle of a formed film is an acute angle with respect to the face of the substrate 31, an inboard-outboard difference (the difference in film thickness on a substrate center direction side and a substrate outer periphery side with respect to the reader stack) occurs at an initial stage of forming a CoPt film.

Figure 7:
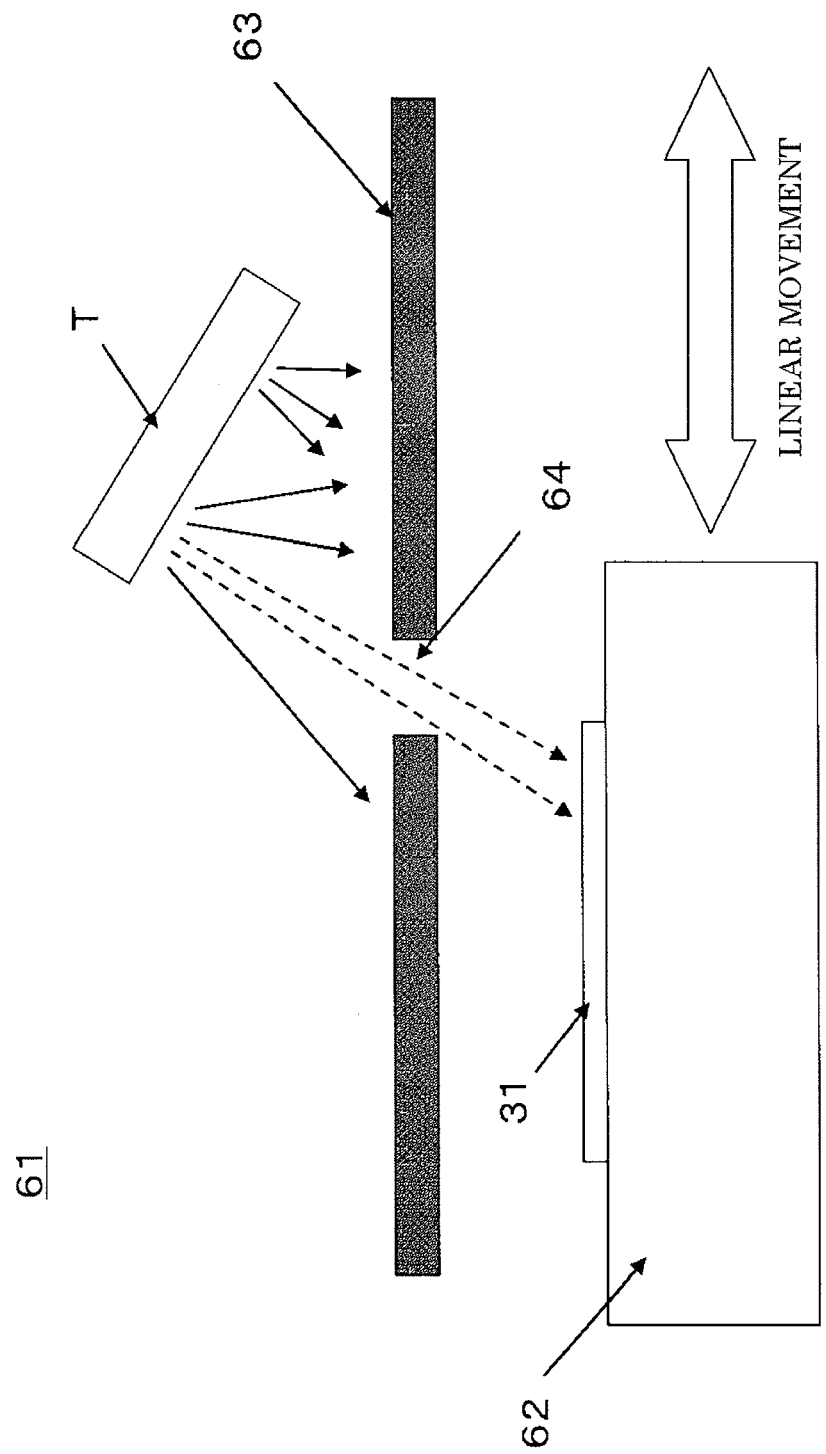
FIG. 7 An outline drawing schematically showing a film forming apparatus used for a film forming method of the embodiment.

To address it, in the film forming method of the embodiment, a film forming apparatus as shown in FIG. 7 is used. FIG. 7 is an outline drawing schematically showing a film forming apparatus used for the film forming method in the embodiment.

As shown in FIG. 7, the film forming apparatus 61 is, for example, an apparatus for forming a film on the substrate 31 held on a substrate holder 62 by IBD or the like, and a slit shutter 63 is disposed in front of a target T obliquely held. The substrate holder 62 has not-shown linear moving means and can linearly move so as to be orthogonal to a slit 64 in the shutter 63. The film forming apparatus 61 has a not-shown elongated rectangular cathode magnet which is parallel to the junction wall surfaces of the reader stack 10.

By using such a film forming apparatus 61, the substrate 31 is moved or scanned with predetermined speed under the longitudinal target T forming a right angle with respect to the drawing sheet of FIG. 7.

Figure 8:
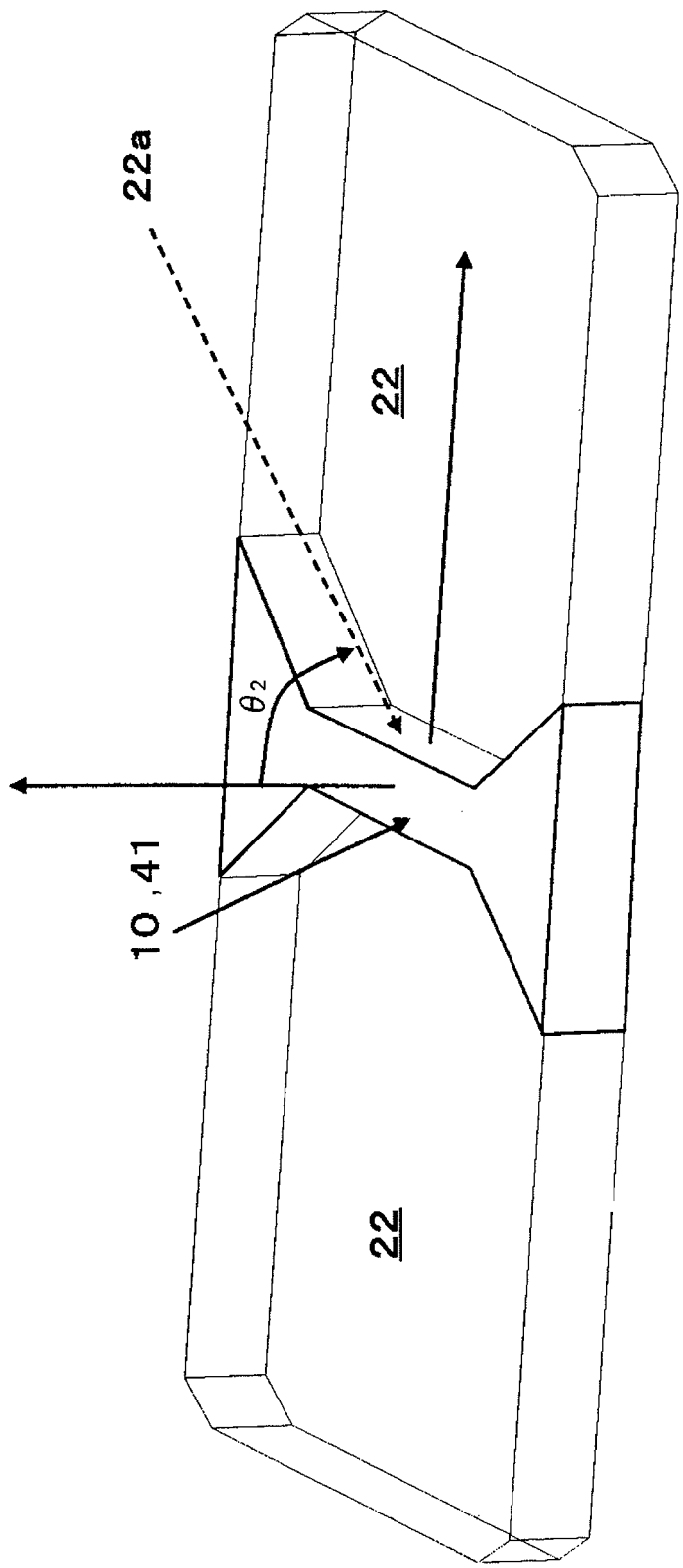
FIG. 8 An outline drawing showing a photoresist pattern masking a center area.

FIG. 8 is an outline drawing showing a photoresist pattern 41 masking the reader stack 10. Two field regions 22 are provided for forming the hard bias stack body. A number of such patterns are formed in parallel on the substrate 31. That is, a plurality of reader stacks 10 are disposed on the substrate, and the hard bias stack bodies are stacked in the field regions 22 on both sides of each of the reader stacks 10 in the same process. The first magnetic layer 22a is formed at a film forming angle $\theta_2$ as shown by a dashed arrow in FIG. 8.

The underlayer 21 is deposited by incidence almost perpendicular to the face of the substrate 31. Most of films are formed over the field region 22, and layers on the reader stack 10 and the PR mask 41 are very thin. The first magnetic layer 22a is formed by two steps.

In the first step, while moving the substrate 31 at predetermined speed under the target T until a film is formed from end to end, a film is formed on the junction wall surface as one of the junction wall surfaces of the reader stack 10 at an acute angle to the surface of the substrate 31. In the following second step, the substrate 31 is turned by 180 degrees and moved below sputter magnetic fluxes so that a film can be formed at the same angle on the other junction wall surface. Although the minimum number of passage times is two, as long as the final thickness (15 to 40 nm) on both sides is the same, the number of passage (reciprocation) times may be increased.

The second magnetic layer 22b can be formed at an angle almost perpendicular to the face of the substrate 31 by the same method as that for the first magnetic layer 22a except for the incident angle. The capping layer 23 (for example, Ta) is formed in a manner similar to the second magnetic layer 22b. Ta is deposited on the field region more than on the junction wall surfaces or the PR mask walls.

The underlayer 21, the second magnetic layer 22b, and the capping layer 23 can be formed by existing IBD or ionized PVD. However, the first magnetic layer 22a is formed by a method using the rectangular target T by using the film forming apparatus 61 in FIG. 7.

In the embodiment, as the first magnetic layer 22a, an alloy Co—Pt which is most generally used is employed. Although another material such as Fe—Pt may be grown by using a face-centered tetragonal structure on the junction wall surface, it is considered that a temperature of 200° C. or higher is necessary. In this case, when a hard mask and RIE (Reactive Ion Etching) are used for formation of the sensor stack body, there is no photoresist (PR) mask 41 at the time of forming the hard bias stack body, and it is suitable.

A Co—Pt (0001) lattice plane can be grown on an MgO (001) lattice plane or a Cr (002) lattice plane. That is, c-axes can be created in a direction almost perpendicular to the junction wall surface (directions of magnetic anisotropy).

The above is based on assumption that all of reader stacks 10 on the substrate 31 are patterned so as to be parallel to each other. The junction wall surfaces of the reader stack 10 are held in parallel to the rectangular target T during film formation.

Specifically, formation of the first magnetic layer 22a has a step of forming the first magnetic layer on one of junction wall surfaces 10a and 10b of the reader stack 10 by linearly moving the substrate 31 at predetermined speed under the target T. The method also has a step of turning the substrate 31 by 180 degrees around its center perpendicular axis as a center, and forming the first magnetic layer on the other surface of the junction wall surfaces 10a and 10b by linearly moving the substrate 31 at predetermined speed under the target T.

On the other hand, as described above, formation of the underlayer 21, the second magnetic layer 22b, and the capping layer 23 is different from that of the first magnetic layer 22a with respect to the film formation angle (the incident angle of sputter particles or the like). However, also in the case of the underlayer 21, the second magnetic layer 22b, and the capping layer 23, the method has a step of forming a film on one of the field regions 22 by linearly moving the substrate 31 at predetermined speed under the target T. The method has a step of turning the substrate 31 by 180 degrees around its center perpendicular axis as a center, and forming a film on the other field region 22 by linearly moving the substrate 31 at predetermined speed under the target T.

An algorithm of the film forming method in the steps of forming films in the field regions is installed as a film formation control program on, for example, a recording device such as a hard disk or ROM provided for a not-shown control system in the IBD system and properly read and executed by a CPU.

A recording medium is a computer-readable portable recording medium. The deposition control program recorded on the recording medium is installed on the storage device. Examples of the recording medium include flash memories such as compact flash (registered trademark), SmartMedia (registered trademark), memory stick (registered trademark), multimedia card, and SD memory card, removable hard disks such as micro drive (registered trademark), magnetic recording media such as floppy disk (registered trademark), magnetooptic recording media such as MO, and optical disks such as CD-R, DVD-R, DVD+R, DVD-RAM, DVD+RW (registered trademark), and PD.

Next, crystal growth in the film forming method of the embodiment will be examined by using XRD (X-ray diffractometer) data or the like.

Figure 9:
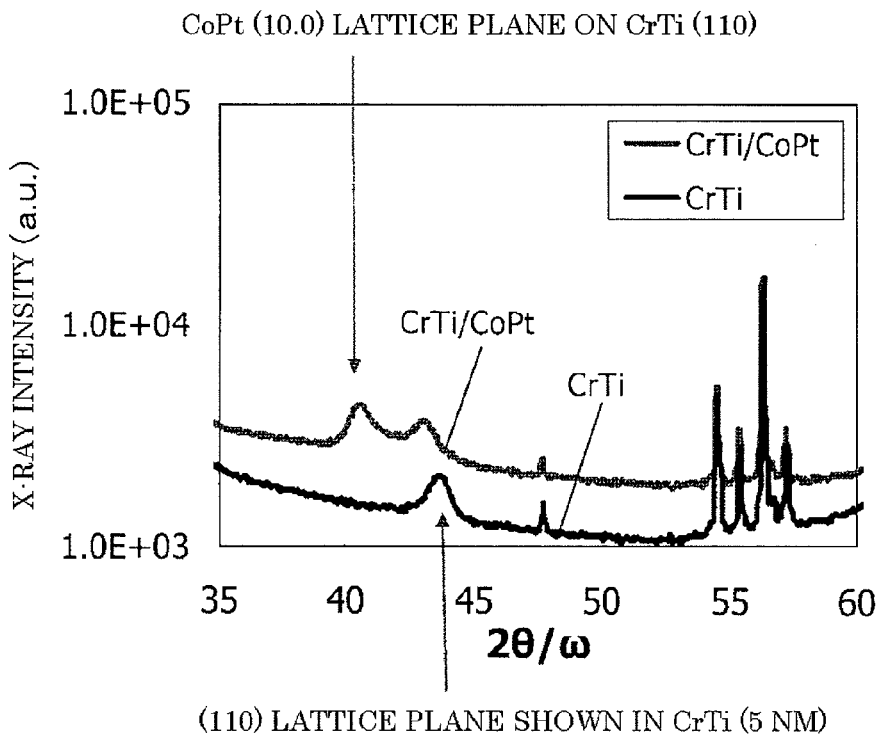
FIG. 9 An explanatory diagram showing XRD spectra in a CrTi underlayer having a (110) lattice plane and CoPt deposited over the underlayer.

FIG. 9 is an explanatory diagram showing XRD spectra in a CrTi underlayer having a (110) lattice plane and CoPt deposited over the underlayer. As shown in FIG. 9, CoPt is grown by having a (10.0) lattice plane on the CrTi underlayer having the (110) lattice plane. That is, crystal c-axes in CoPt are in the film plane.

Figure 10:
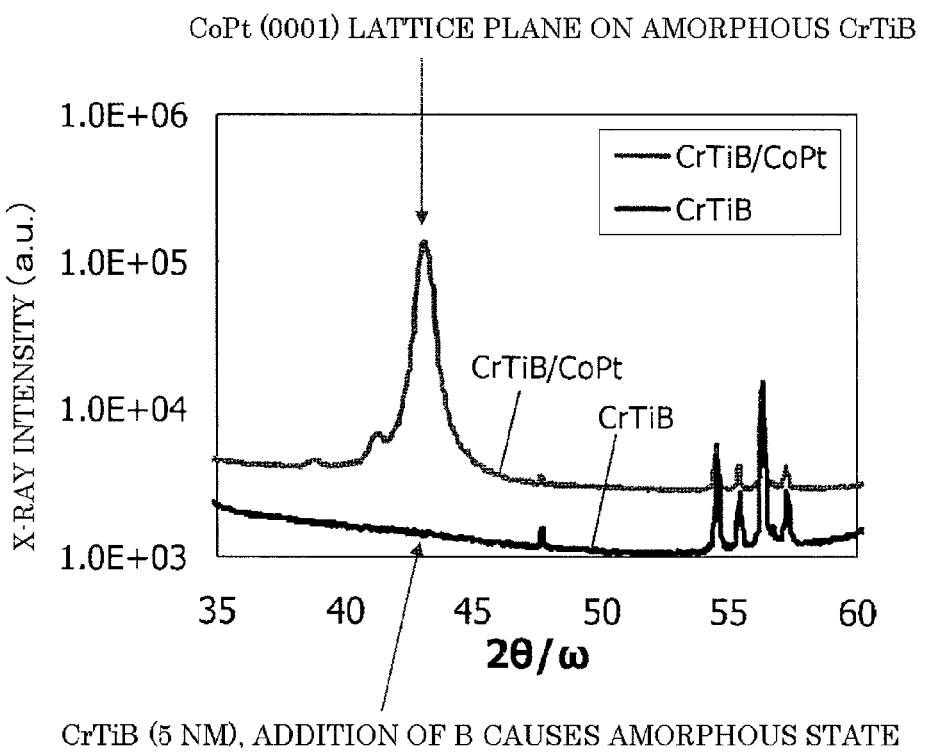
FIG. 10 An explanatory diagram showing XRD spectra in a CrTiB underlayer and CoPt deposited over the underlayer.

FIG. 10 is an explanatory diagram showing an XRD spectrum in a CrTiB underlayer. As shown in FIG. 10, the peak representing the (110) plane cannot be observed in CrTiB. By adding B, this film is in an amorphous state, and CoPt grown on this amorphous layer shows a strong (0001) lattice plane. This definitely means that the crystal c-axes in CoPt are oriented in a direction perpendicular to the film plane. That is, the above orientation can be expected when there are an amorphous layer and a very thin CrTi layer on the junction wall surfaces.

Figure 11:
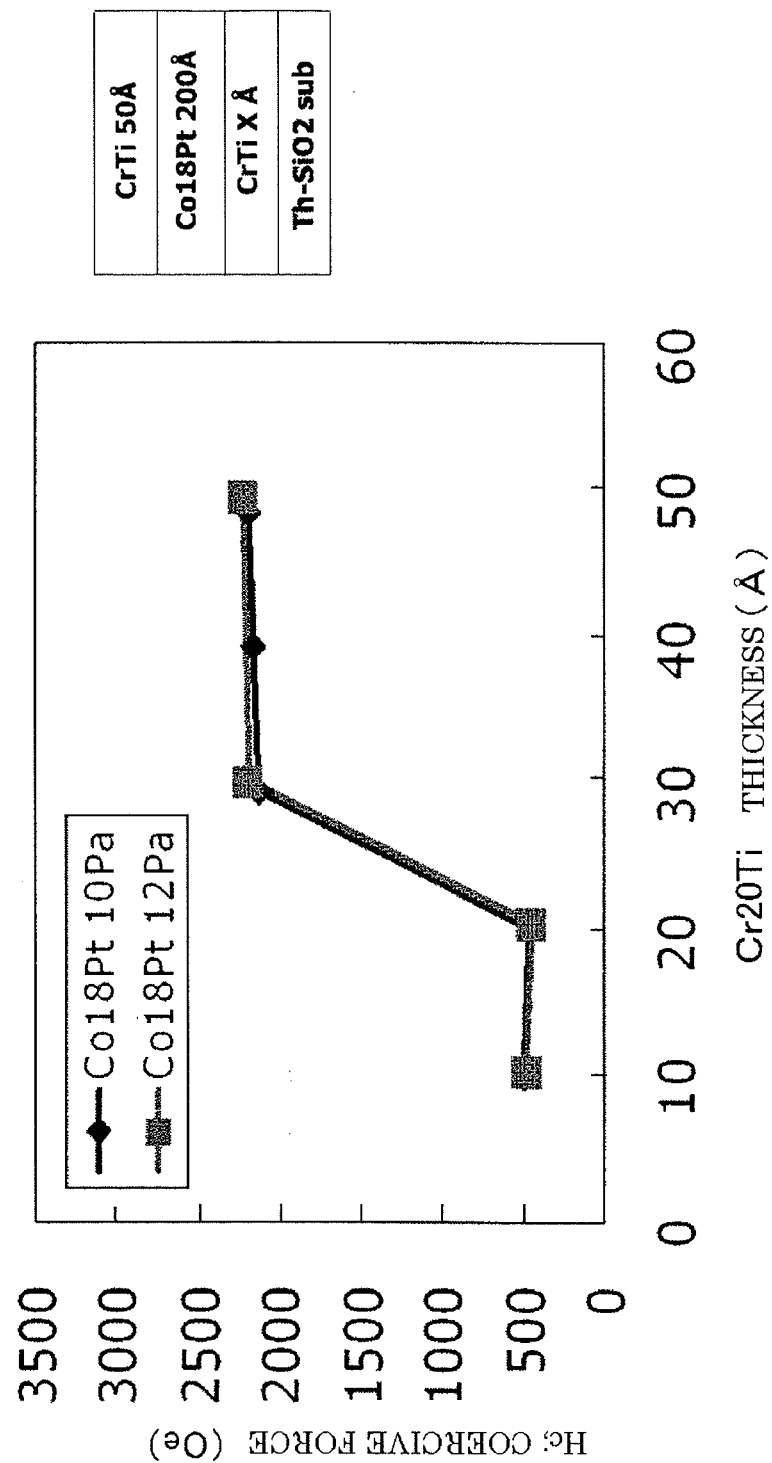
FIG. 11 An explanatory diagram showing an in-plane coercive force Hc of a Co-18Pt layer on the CrTi underlayer formed at two types of pressures in an ionized PVD system.

FIG. 11 is an explanatory diagram showing an in-plane coercive force Hc in the case where Co-18Pt is formed at two types of film forming pressures on the CrTi underlayer by using an ionized PVD system. As shown in FIG. 11, in the case where the thickness of the underlayer is 3 nm or more, favorable Hc is obtained in the in-plane direction. These results suggest that the (110) lattice plane is not formed yet when the thickness is less than 3 nm. In the case of CrTi, the minimum film thickness required to obtain a favorable (110) lattice plane is approximately 2.5 nm. As the film is thicker, the (110) lattice plane is developed more, and a sufficiently high Hc can be obtained by the following CoPt layer.

FIG. 12 shows a coercive force in the case where the CoPt layer of 20 nm is formed on a double-layered underlayer. As shown in FIG. 12, in the case where CrTiB is an initial layer, a CrTi underlayer (seed layer) of 3 nm is required to obtain a high Hc. This corresponds to FIG. 11, which shows that CrTi of 3 nm is required to obtain a high Hc. This demonstrates that CrTiB does not have an appropriate (110) lattice plane to function as a pre-underlayer layer (pre-seed layer) for CrTi. The XRD data also shows a result that it is an amorphous film. However, in the case where CrTiB is formed on CrTi of 3 nm, it maintains a lattice plane of CrTi, and a high coercive force can be obtained.

Referring to FIG. 6 again, the above result suggests that oblique incidence film formation of the thin CrTiB seed layer (approximately 1 nm) after formation of the CrTi underlayer 21 (for example, 3 nm) in a direction almost perpendicular to the film formation face can further improve the CoPt lattice plane on the junction wall surfaces. The CrTi underlayer 21 on the field region 22 already has a (110) lattice plane, and the overlying CrTiB layer does not much influence on growth of the (10.0) lattice plane of the second CoPt layer.

The seed layer which improves the CoPt (0001) lattice plane on the junction wall surfaces 10a and 10b needs to be very thin in order to keep the distance between the magnetic layer and the free layer minimum. The seed layer becomes very thin in the field region 22 by oblique film formation. Nevertheless, it should not prevent heteroepitaxial growth of the two-dimensional random magnetic layer on the underlayer 21. Accordingly, the seed layer preferably adopts either composition having a BCC such as CrTiB or Ta or a hexagonal crystal structure (hcp) such as Ru or Ti.

According to A. G. Roy and D. E. Laughlin (JAP vol. 91, pp. 8076-8078, 2002), the Ta and Ti amorphous layer can orient the c-axes perpendicularly in a favorable manner when the thickness is 3 nm or more. The lack of the (0001) lattice plane structure in the case of a thin seed layer is probably caused by impurities in the underlayer (seed) layer and water molecules on the face of the substrate before film formation. In the case where the underlayer is formed in a state of no impurities on the surfaces of the junction wall surfaces, a thinner seed layer is supposed to be enabled. Ru is widely used for a perpendicular medium whose c-axis orientation distribution is requested with extreme severity, and the optimum film thickness is 20 nm or more.

As described above, with the magnetic sensor stack body 1 and the method of forming the same of the embodiment, there is an excellent effect that the crystal c-axes in the first magnetic layer 22*a* formed on the junction wall surfaces 10*a* and 10*b* on both sides of the reader stack are oriented in the direction almost perpendicular to the junction wall surfaces. That is, the c-axes near the junction wall surfaces are aligned (one-dimensional) while the c-axes in the second magnetic layer 22*b* in the regions apart from the junction wall surfaces are two-dimensionally random. Although it is considered that the OR of the second magnetic layer 22*b* in the regions apart from the junction wall surfaces is slightly increased by oblique incidence (>50 degrees) film formation of the seed layer and the underlayer, it is not always caused by the oblique film formation of the magnetic layer.

Although the preferred embodiments of the present invention have been described above, they are illustrative for explaining the present invention, and the scope of the present invention is not limited to the embodiments. The invention can be executed in various modes different from the foregoing embodiments without departing from the gist of the invention.

For example, although the film forming method by IBD has been described in the foregoing embodiments, the invention can be also applied to a film forming method such as PVD.

DESCRIPTION OF THE REFERENCE NUMERALS

1 magnetic sensor stack body
10 magnetoresistive element (reader stack)
10*a*,10*b* junction wall surface
11 pre-seed layer
12 seed layer
13 antiferromagnetic pinning layer (AFM layer)
14 synthetic antiferromagnetic layer (SAF layer)
14*a* pinned layer
14*b* coupling layer
14*c* reference layer
15 spacer layer
16 free layer
17*a*,17*b* capping layer
19 insulating layer
20 hard bias stack body
21 underlayer
22 field region
22*a* first magnetic layer
22*b* second magnetic layer
23 capping layer
31 substrate (bottom shield layer)
32 top shield layer
41 photoresist mask
51 ion beam deposition system
52 beam irradiation apparatus
53 rotation carousel
54 substrate holder
61 deposition apparatus
62 substrate holder
63 shutter
64 slit
IB ion beam
T target

The invention claimed is:

1. A magnetic sensor stack body comprising, on sides of opposed junction wall surfaces of a magnetoresistive element disposed on a substrate, field regions for applying a bias magnetic field to the element,
    wherein the field region includes first and second magnetic layers having magnetic particles having crystal c-axes,
    the first magnetic layer is disposed adjacent to the junction wall surface in the field region, the crystal c-axes in the first magnetic layer are aligned and oriented along an ABS in a film plane,
    the second magnetic layer is disposed adjacent to the first magnetic layer in the field region, the crystal c-axes direction in the second magnetic layer are distributed at random in a plane,
    the first magnetic layer is made of Co—Pt, Co—Cr—Pt, crystal structure (hcp) selected Cr—Pt, or Fe—Pt, Co—Pt, or an alloy thereof,
    the second magnetic layer is made of Co—Pt, Co—Cr—Pt, or an alloy thereof,
    an underlayer made of Cr, Cr—Mo, Cr—Ti, Nb, Ta, W or an alloy thereof having a body-centered cubic crystal structure (bcc) of them is provided on the field region and the junction wall surface,
    the underlayer has a thickness which is 3 to 8 nm in the field region and is less than 3 nm in the junction wall surface,
    the underlayer has a (110) lattice plane in the field region and is in an amorphous state in which no (110) lattice plane is formed in the junction wall surface, and
    the first magnetic layer is formed on the underlayer and has a cross-sectional shape, on a surface parallel to the ABS, of an approximate parallelogram formed by a pair of sides along the junction wall surface and a pair of sides along a face of the substrate in a region adjacent to the junction wall surface.

2. The magnetic sensor stack body according to claim 1, wherein the field region and the junction wall surface are provided between the underlayer and the first magnetic layer with a seed layer selected from CrB, CrTiB, MgO, Ru, Ta, and Ti and a group of alloys of them, and
    the seed layer has a thickness which is less than 1 nm in the field region and is 0.5 to 2 nm in the junction wall surface.

3. The magnetic sensor stack body according to claim 1, wherein the field region and the magnetoresistive element are covered with a capping layer made of a material selected from Cr, Ru, Ta, Ti, a group of alloys of Cr, Ru, Ta, and Ti, and C.

4. The magnetic sensor stack body according to claim 3, wherein the field region and the junction wall surface are provided with an insulating layer, and
    the insulating layer has a thickness of 2 to 10 nm on the field region and a thickness of 2 to 5 nm on the junction wall surface.

5. The magnetic sensor stack body according to claim 4, wherein a shield layer made of a soft magnetic material is provided below the insulating layer and on the capping layer.

6. A method of forming a magnetic sensor stack body, for forming a hard bias stack body for applying a bias magnetic field to a magnetoresistive element in field regions on sides of opposed two junction wall surfaces of the magnetoresistive element disposed on a substrate, wherein a process of forming the hard bias stack body comprises:
- a step of forming an underlayer made of Cr, Cr—Mo, Cr—Ti, Nb, Ta, W or an alloy thereof having a body-centered cubic crystal structure (bcc) at a film forming angle $\theta_1$ ($\theta_1$=0 to 25 degrees) from the normal of the substrate to have a thickness which is 3 to 8 nm in the field region and is less than 3 nm in the junction wall surface;
- a step of forming on the underlayer a first magnetic layer made of Co—Pt, Co—Cr—Pt, Fe—Pt, or an alloy thereof at a film forming angle $\theta_2$ ($\theta_2$=50 to 90 degrees) from the normal of the substrate;
- a step of forming on the first magnetic layer a second magnetic layer made of Co—Pt, Co—Cr—Pt, or an alloy thereof at a film forming angle $\theta_3$ ($\theta_3$=0 to 25 degrees) from the normal of the substrate; and
- a step of forming on the second magnetic layer a capping layer at a film forming angle $\theta_4$ ($\theta_4$=0 to 45 degrees) from the normal of the substrate.

7. The method of forming a magnetic sensor stack body according to claim 6, wherein the first magnetic layer is formed on one of junction wall surfaces of the magnetoresistive element while linearly moving the substrate at predetermined speed under an elongated target parallel to the junction wall surfaces of the magnetoresistive element, the substrate is turned by 180 degrees around its center perpendicular axis as a center, and the first magnetic layer is formed on the other surface of the junction wall surfaces while linearly moving the substrate at predetermined speed under the target.

8. The method of forming a magnetic sensor stack body according to claim 7, wherein the underlayer, the second magnetic layer, and the capping layer are formed on one of field regions while linearly moving the substrate at predetermined speed under the target, the substrate is turned by 180 degrees around its center perpendicular axis as a center, and the layers are formed on the other field region while linearly moving the substrate at predetermined speed under the target.

9. The method of forming a magnetic sensor stack body according to claim 6, wherein the hard bias stack body is formed by ion beam deposition.

10. The method of forming a magnetic sensor stack body according to claim 6, wherein a plurality of magnetoresistive elements are disposed on the substrate, and the hard bias stack bodies in the plurality of magnetoresistive elements are formed by the same process.

* * * * *